United States Patent [19]

Kasugai

[11] Patent Number: 4,772,850
[45] Date of Patent: Sep. 20, 1988

[54] MAGNETIC RESONANCE IMAGING SYSTEM

[75] Inventor: Takao Kasugai, Ootawara, Japan

[73] Assignee: Kabushiki Kaisha Toshiba, Kawasaki, Japan

[21] Appl. No.: 114,866

[22] Filed: Oct. 30, 1987

[30] Foreign Application Priority Data

Oct. 31, 1986 [JP] Japan ............... 61-258357

[51] Int. Cl.⁴ .................................. G01R 33/20
[52] U.S. Cl. ...................... 324/309; 324/312
[58] Field of Search ........... 324/300, 307, 309, 312, 324/313, 314

[56] References Cited

U.S. PATENT DOCUMENTS

| | | | |
|---|---|---|---|
| 4,472,683 | 9/1984 | Sekihara | 324/307 |
| 4,599,565 | 7/1986 | Hoenninger | 324/309 |
| 4,612,504 | 9/1986 | Pelc | 324/309 |
| 4,625,171 | 11/1986 | Sekihara | 324/309 |
| 4,629,989 | 12/1986 | Riehl | 324/318 |
| 4,644,280 | 2/1987 | Paltiel | 324/309 |
| 4,649,347 | 3/1987 | Hwang et al. | 324/309 |
| 4,727,325 | 2/1988 | Matsui | 324/309 |

*Primary Examiner*—Michael J. Tokar
*Attorney, Agent, or Firm*—Foley & Lardner, Schwartz, Jeffery, Schwaab, Mack, Blumenthal & Evans

[57] ABSTRACT

A magnetic resonance imaging system visualizes a tomographic image including a portion of interest by two-dimensional Fourier transformation of magnetic resonance data in readout and phase encoding directions. The system has an input section for inputting the central position of the portion of interest, and an image processing section for shifting data obtained by the Fourier transformation, so that the central position of the portion of interest is located at substantially the center of an image area, and transferring data at an end portion which falls outside the image area upon shifting into an opposite image area.

5 Claims, 6 Drawing Sheets

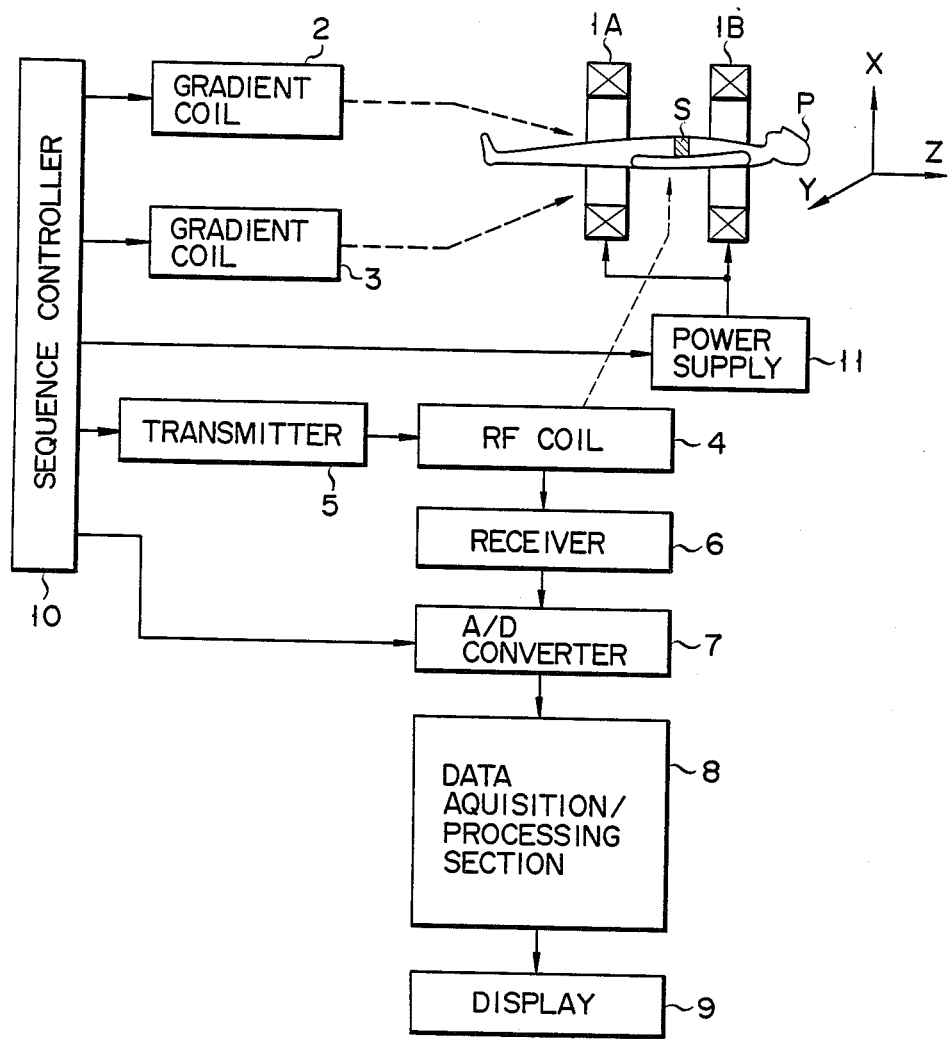
F I G. 2

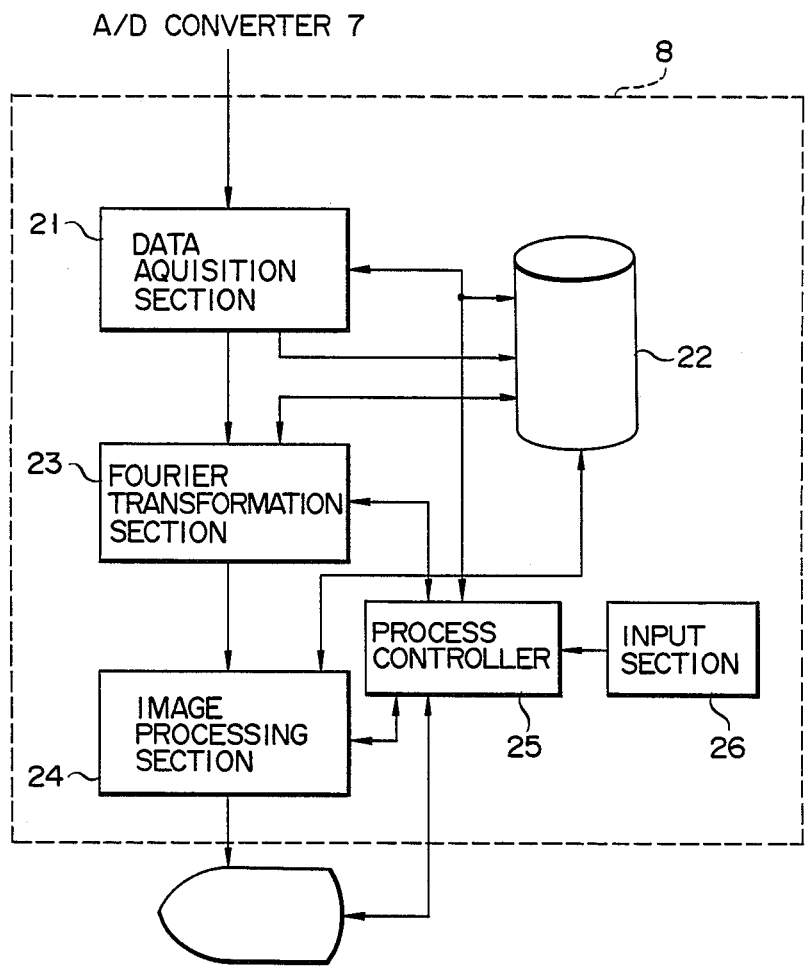
F I G. 3

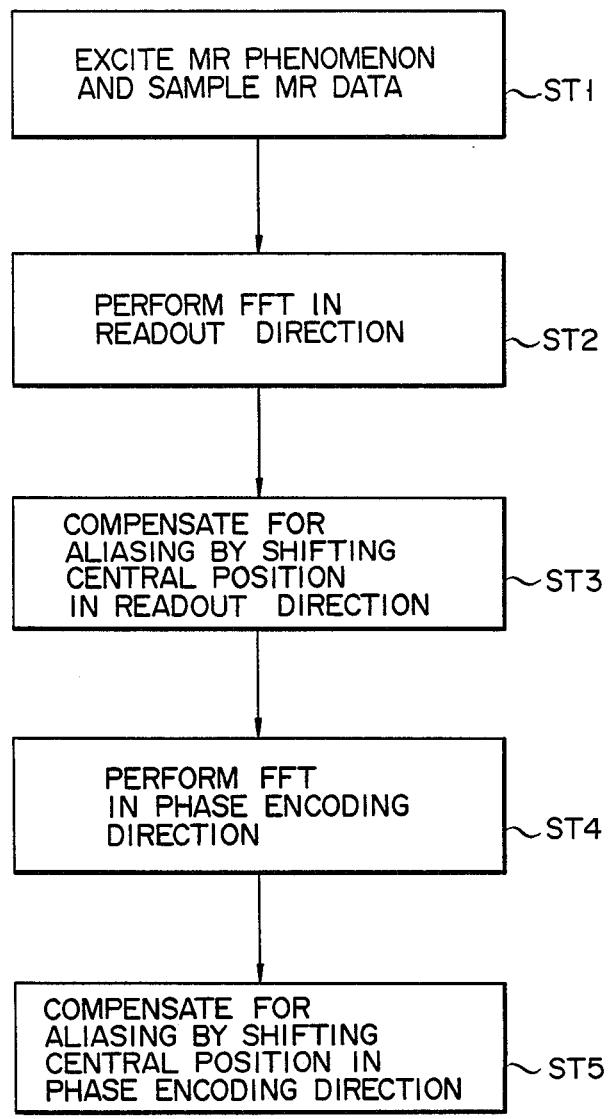
F I G. 6

MAGNETIC RESONANCE IMAGING SYSTEM

BACKGROUND OF THE INVENTION

The present invention relates to a magnetic resonance imaging (MRI) system for obtaining image data reflecting density and/or relaxation time data of nuclear spins of specific nuclei in an object ( e.g., a living subject or a patient) being examined through utilizing a magnetic resonance (MR) phenomenon.

In an MRI system for, for example, a medical diagnosis, a uniform static field is applied to a subject under examination (i.e. a patient), a linear gradient field is appropriately superposed on the static field, and a high-frequency field acting as an excitation pulse is applied to the patient, to excite an MR phenomenon. MR signals produced by the MR phenomenon are detected and acquired, and acquisition data is subjected to two-dimensional Fourier transformation or other suitable process, in order to obtain tomographic image data of a predetermined portion of the patient.

However, since, in the case of the imaging method used by the conventional system, MR signals from a portion separated from the center of the linear gradient field are acquired as high-frequency signals having a frequency depending on a distance from the center. When these signals are two-dimensional Fourier transformed to be visualized, "aliasing" often occurs in a phase encoding direction for a normal scan operation.

This phenomenon will now be explained in detail, with reference to a case wherein a tomographic image of the patient's head is to be obtained. FIG. 1 shows an example of a tomographic image obtained by reconstruction when a patient is placed in a location separated from the center of an image, i.e., the central position of the linear gradient field by a predetermined value or more. In this case, an image of the patient's nose located near the left end of an image area falls outside the image area, and is appeared on the right end at the opposite side in the image area due to aliasing, as shown in FIG. 1.

This problem can be prevented in such a manner that the center of the patient for which a tomographic image is to be obtained is always located at the center of the linear gradient field. However, the position of the patient relative to the linear gradient field may be limited by the range of movement of the bed on which the patient lies or by the position of a portion of interest to be imaged. Thus, the above problem often cannot be solved.

As another means for solving the above problem, a data sampling interval or a phase encoding pitch is shortened in order to expand the imaging area. However, in order to employ this method successfully and to maintain the spatial resolution at as high a level as that before application of this method, the matrix size of the acquisition data must be increased. Thus, if this method is employed, the scan time (the time required for MR excitation-MR data acquisition) and the reconstruction time (the time required for obtaining an image from the acquisition data) are prolonged, with the result that the storage area necessary for storing data during and data after processing is undesirably increased.

SUMMARY OF THE INVENTION

As has been described above, the problem of aliasing due to noncoincidence between the center of a portion of interest and the center of a linear gradient field cannot often be solved merely by means of a mechanical adjustment operation. In the method for shortening a sampling interval to prevent aliasing, an increase in processing time and an increase in storage capacity occur.

It is an object of the present invention to provide an MRI system which can obtain an image free from aliasing without an accompanying increase in processing time.

An MRI system according to the present invention for performing two-dimensional Fourier transformation of MR data in readout and phase encoding directions to obtain an MR image of a selected slice including a portion of interest, comprises an input section for inputting a central position of the portion of interest, and an image processing section for shifting, in the readout direction and/or phase encoding direction, data obtained after the MR data is Fourier transformed in the readout and phase encoding directions so that the central position of the portion of interest is located at substantially the center of an image area, and transferring data at an end portion in the shifting direction, which is located outside an image area upon shifting, into the opposite image area (from which image data lacks upon shifting).

In the conventional MRI system, the center of an image area corresponds to the center of the linear gradient field which is uniquely determined by the mechanical arrangement of a gradient field coil. If the center of a portion of interest is deviated from the central position, a portion of an object image falls outside the image area, and aliasing of an image occurs.

In the MRI system according to the present invention, data indicating the central position of the portion of interest is input beforehand, data is shifted along at least one of the read and phase encoding directions so that the central position of the portion of interest is located at substantially the center of the image area, and data in the aliasing portion falling outside the image area is transferred to an image area at an opposite side, thereby obtaining an appropriate image free from the influence of aliasing.

According to the MRI system of the present invention, since a sampling pitch can be left unchanged, an appropriate image free from the influence of aliasing can be easily obtained without accompanying an increase in processing time and an increase in storage area, as compared to a conventional system in which a sampling pitch is shortened to visualize an area in a wider range so as to prevent aliasing.

BRIEF DESCRIPTION OF THE DRAWINGS

FIG. 2 is a block diagram showing an arrangement of an MRI system according to an embodiment of the present invention;

FIG. 3 is a block diagram showing, in detail, a portion of the system shown in FIG. 2;

FIG. 6 is a flow chart for explaining the operation of the system shown in FIGS. 2 and 3.

DETAILED DESCRIPTION OF THE PREFERRED EMBODIMENTS

Figure 1:
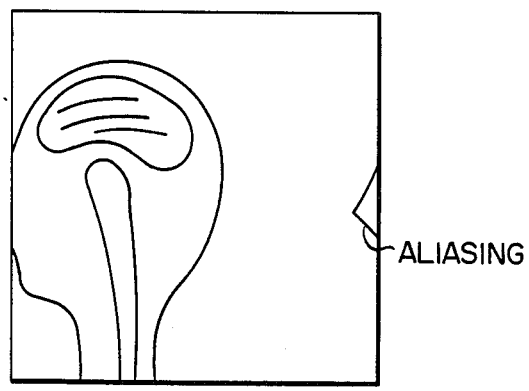
FIG. 1 illustrates an image influenced by aliasing.

FIG. 2 shows an arrangement of an MRI system according to an embodiment of the present invention.

This system comprises static field coils 1A and 1B, gradient coils 2 and 3, RF (radio frequency) coil 4, transmitter 5, receiver 6, A/D converter 7, data acquisition/processing section 8, display 9, sequence controller 10, and power supply 11.

A pair of static field coils 1A and 1B are driven by power supply 11 to generate a uniform static field applied to object, i.e. patient P. First gradient coil 2 generates a gradient field in a Z-direction applied to patient P in order to determine positions of selected slices including a portion of interest of patient P. Second gradient coil 3 generates a gradient field in a predetermined direction on the X-Y plane applied to patient P, i.e., a readout and encode gradient field. RF coil 4 is driven by transmitter 5 to apply $\pi/2$ and $\pi$ pulses to patient P at predetermined timings and to detect MR echoes (spin echoes) generated in patient P. Coil 4 supplies the detected MR echoes to receiver 6. Receiver 6 detects the MR echo signals detected through RF coil 4 using a phase-sensitive detector such as a quadrature detector. A/D converter 7 converts the MR echo signals detected and extracted by receiver 6 into digital MR data, and supplies the digital data to data acquisition/processing section 8. Section 8 acquires and stores the MR data supplied through A/D converter 7. Section 8 performs predetermined image processing of the acquired MR data to obtain MR image data. The predetermined processing includes Fourier transformation such as FFT (fast Fourier transformation) and processing for compensating for aliasing (to be described later). Display 9 displays an image based on the MR image data generated by section 8. Sequence controller 10 appropriately controls gradient coils 2 and 3, transmitter 5, A/D converter 7, and power supply 11 so that MR excitation and MR data acquisition are performed in accordance with a predetermined sequence.

FIG. 3 shows a detailed arrangement of data acquisition/processing section 8.

Data acquisition/processing section 8 comprises data acquisition section 21, storage device 22, Fourier transformation section 23, image processing section 24, process controller 25, and input section 26.

Data acquisition section 21 acquires MR data output from A/D converter 7. Storage device 22 comprises, e.g., a magnetic disk device, and stores MR data acquired by section 21, intermediate data during image processing, and final MR image data. Fourier transformation section 23 reads out the MR data stored in storage device 22 to perform two-dimensional Fourier transformation, thereby generating MR image data. Image processing section 24 incorporates a temporary storage memory, and is operated in association with section 23 to eliminate the influence of aliasing. Sections 23 and 24 store or readout intermediate data during processing in or from storage device 22 as needed, and also store final MR image data as a result of processing in storage device 22. The MR image data is supplied to display 9, and is displayed thereon. Process controller 25 controls the operations of data acquisition section 21, storage device 22, Fourier transformation section 23, image processing section 24, and display 9. Input section 26 is arranged to input the central position of a portion of interest, and can set an arbitrary central position upon operation of an operator. Input section 26 causes display 9 to display a low-resolution tomographic image, and to superimpose a position marker on a display screen. Section 26 thus causes display 9 to move the position marker on the displayed image to obtain positional data corresponding to the position of the position marker. Alternatively, input section 26 may adopt a projector for directly projecting a light beam on a body surface of patient P, and convert the position of a beam spot on the body surface of patient P into an electrical signal to obtain positional data.

The arrangement and operation of data acquisition/processing section 8 will be described in detail.

Fourier transformation section 23 reads out MR data stored in storage device 22, and executes FFT of the readout MR data in the readout direction. Section 23 stores the data subjected to FFT in the temporary storage memory of image processing section 24 and/or storage device 22, and thereafter, executes FFT in the encoding direction. Image processing section 24 receives, through process controller 25, data indicating the central position of a portion of interest input from input section 26, and performs data compensation for eliminating the influence of aliasing with respect to the data which has already been subjected to FFT in the readout and encoding directions and is stored in the internal temporary storage memory or storage device 22. In the processing of section 24, data is sorted on the memory in section 24 as follows. Data which has already been subjected to FFT in the readout and encoding directions is shifted along the above directions so that the central position of the portion of interest is located at substantially the center of the image area, and image data located at the distal end portion in the shifting direction, which will fall outside the image area upon shifting, is transferred to an image area at an opposite end portion.

The operation of image processing section 24 will be described in detail.

Figure 4A:
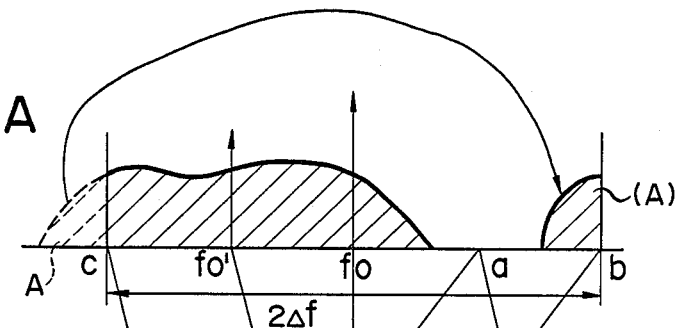
FIGS. 4A and 4B are views for explaining a principle for compensating aliasing in a read direction.
Figure 4B:
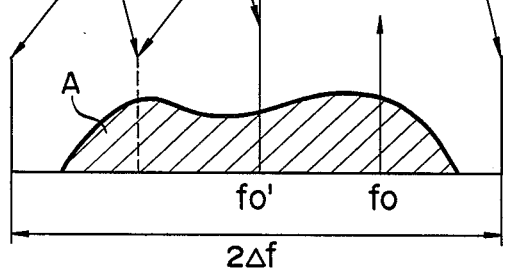

Data sorting in the readout direction for data subjected to first FFT of two-dimensional Fourier transformation, i.e., FFT in the readout direction, will be explained with reference to FIGS. 4A and 4B. FIG. 4A shows a $2\Delta f$ image area having central frequency f0 as the center. As shown in FIG. 4A, in data in the readout direction obtained after FFT, portion A which should be originally located at a position indicated by a dotted curve appears at a position indicated by a solid curve due to aliasing. In FIG. 4A, f0' indicates a frequency corresponding to the central position of the portion of interest in the readout direction, which is input by section 26 in advance.

As an example of data sorting for compensating for aliasing, data is sorted on the memory in section 24. In this case, data at point a at the middle of an image portion due to aliasing and an original image portion in FIG. 4A is readout as a start address, and this data is written at a write start address of a memory area for storing sorted data shown in FIG. 4B. This data read/write access, i.e., data transfer, is sequentially performed up to point b at the right end of FIG. 4A. Thereafter, a read address is assigned at point c at the left end of FIG. 4A, and similar data transfer is performed. As a result, data for which the influence of aliasing is compensated as shown in FIG. 22 is generated, and is stored in storage device 22.

Figure 5A:
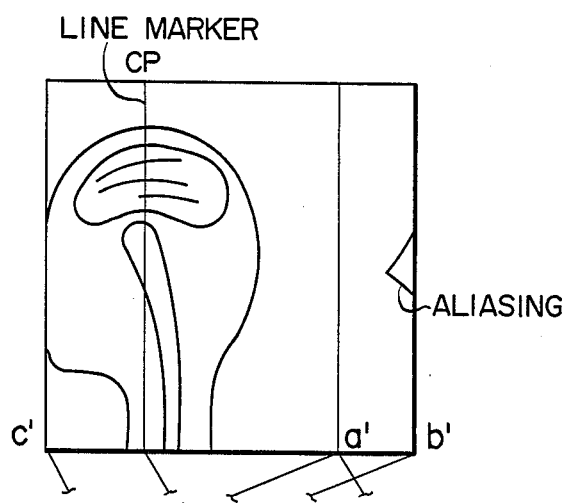
FIGS. 5A and 5B are views for explaining a principle for compensating aliasing in a phase encoding direction.
Figure 5B:
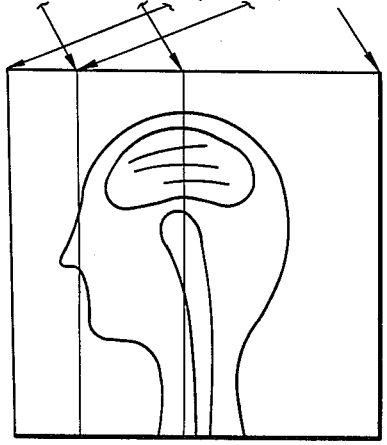

Data sorting in the phase encoding direction for data subjected to second FFT of two-dimensional Fourier transformation, i.e., FFT in the phase encoding direction, will be explained with reference to FIGS. 5A and 5B. For this processing, central position cp associated with the phase encoding direction of the portion of interest is designated by input section 26 in advance. For example, image data in this state is displayed, and a line marker is moved on the screen upon operation of input section 26 by an operator so as to designate the central position of the portion of interest. Thereafter, the read addresses are changed in the order of positions a', b', and c' shown in FIG. 5A, so that data readout from the temporary storage memory of section 24 or storage device 22 are sequentially written in a predetermined area of the memory to sort data. In this manner, image data free from the influence of aliasing shown in FIG. 5B can be generated. The image data is stored in storage device 22.

Note that read start positions a and a' are determined so that the central position (of the portion of interest) input from input section 26 is located at substantially the center of a final image area.

The operation of this system will be described with reference to the flow chart shown in FIG. 6.

Figure 7A:
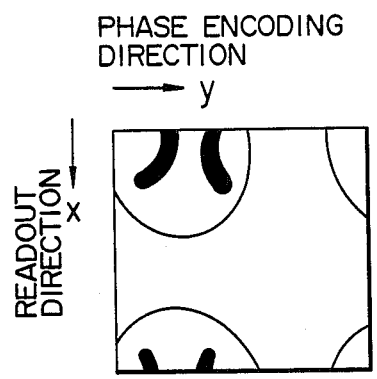
FIGS. 7A to 7C are views for explaining a compensating operation of the influence of aliasing in the system shown in FIGS. 2 and 3.
Figure 7B:
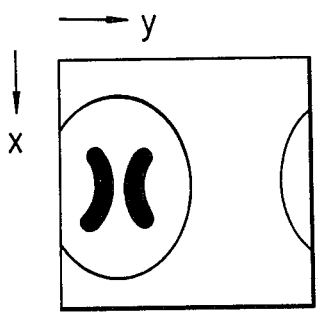
Figure 7C:
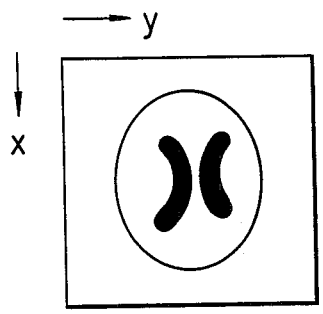

Coils 1A, 1B, 2, 3, and 4 are periodically driven in accordance with a predetermined sequence of the two-dimensional Fourier method to excite the MR phenomenon. Upon each excitation, MR data for one line in the read direction are received by receiver 6 through RF coil 4. The MR signals received by receiver 6 are sampled by data acquisition section 21 of data acquisition/processing section 8 through A/D converter 7 at a predetermined sampling pitch for each line in the readout direction, and are sequentially stored in storage device 22 (step ST1). The data stored in storage device 22 are subjected to FFT in the readout direction as first FFT for each line by Fourier transformation section 23, and the resultant data are temporarily stored in the temporary storage memory in section 24 and/or storage device 22 (step ST2). FIG. 7A imaginarily shows the image data after the first FFT is completed in a real space. In practice, since this image data is not converted in the phase encoding direction in the real space, it is not already visualized in the phase encoding direction. However, ideally, this image data includes image data influenced by aliasing in both the read and phase encoding directions. Thus, data sorting in the readout direction is performed by section 24 to compensate for aliasing in the readout direction (step ST3). FIG. 7B ideally shows the resultant image data. Next, the image data obtained as described above is subjected to FFT in the phase encoding direction as the second FFT by Fourier transformation section 23 (step ST4). Thereafter, data sorting in the phase encoding direction is performed by image processing section 24, and an image free from aliasing in both the readout and phase encoding directions can be reconstructed, as shown in FIG. 7C. This image data is supplied to display 9, and is displayed thereon. In addition, the image data is stored in storage device 22.

The present invention is not limited to the above embodiment, and various changes and modifications may be made within the spirit and scope of the invention.

In the above embodiment, the data sorting in the readout direction is first performed after the FFT in the readout direction is completed, and thereafter, the FFT and data sorting in the phase encoding direction are performed. In this case, the above processing can be continuously executed for each line. However, the present invention is not limited to this. For example, after the two-dimensional Fourier transformation is completed, image processing for eliminating the influence of aliasing in both the read and phase encoding directions may be performed.

As has been described above, as input section 26, i.e., a device for inputting the central position of a portion of interest, a line marker is superimposed on an image acquired for positioning (an image having a resolution lower than that for normal diagnosis), and the position of the line marker is changed by operation to input the central position. Alternatively, a light beam forming a line or a point-like spot is projected onto a body surface of a patient by a projector, and a mechanical position of the projector is converted into an electrical signal so as to designate the central position of the portion of interest.

A processing method in image processing section 24 for compensating for aliasing is not limited to a data sorting method by data read/write access but may be achieved by only address designation without causing folding during a data read operation. The present invention is not limited to the data sorting operation on the memory. For example, the data shift and data compensation operations may be equivalently realized by a hardware means.

What is claimed is:

1. A magnetic resonance imaging system for causing a magnetic resonance phenomenon in a selected portion of an object under examination, acquiring magnetic resonance data induced by the magnetic resonance phenomenon, and performing two-dimensional Fourier transformation in readout and phase encoding directions, with respect to the acquired data, to visualize a tomographic image including a portion of interest, comprising:

input means for inputting a central position of the portion of interest; and image processing means for shifting data obtained after the Fourier transformation in at least one of the readout and phase encoding directions, so that the central position of the portion of interest is located at substantially the center of an image area, and transferring data at a shift end side which falls outside the image area upon shifting into an opposite image area.

2. A system according to claim 1, wherein said image processing means comprises means for shifting and transferring the data in the readout and phase encoding directions each time Fourier transformation in each of the readout and phase encoding directions is completed.

3. A system according to claim 1, wherein said image processing means comprises means for shifting and transferring the data in the readout and phase encoding directions after Fourier transformation in both the readout and phase encoding directions is completed.

4. A system according to claim 1, wherein said input means includes means for displaying an object image for positioning on a display device and superimposing a positioning marker on the displayed image, so that said marker is moved to input a desired central position.

5. A system according to claim 1, wherein said input means includes projection means for projecting a light beam onto the object, and means for inputting a beam position of said projection means as an electrical signal.

* * * * *